US009905716B2

(12) United States Patent
Garandet et al.

(10) Patent No.: US 9,905,716 B2
(45) Date of Patent: Feb. 27, 2018

(54) METHOD FOR MANUFACTURING A MONOLITHIC SILICON WAFER COMPRISING MULTIPLE VERTICAL JUNCTIONS

(71) Applicant: COMMISSARIAT A L'ENERGIE ATOMIQUE ET AUX ENERGIES ALTERNATIVES, Paris (FR)

(72) Inventors: Jean-Paul Garandet, Le Bourget du Lac (FR); Nicolas Chaintreuil, Montmelian (FR); Annalaura Fasiello, Milan (IT); Eric Pilat, Brison-Saint-Innocent (FR); Yannick Veschetti, Concarneau (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 154 days.

(21) Appl. No.: 14/425,968

(22) PCT Filed: Sep. 3, 2013

(86) PCT No.: PCT/IB2013/058262
§ 371 (c)(1),
(2) Date: Mar. 4, 2015

(87) PCT Pub. No.: WO2014/037878
PCT Pub. Date: Mar. 13, 2014

(65) Prior Publication Data
US 2015/0249173 A1     Sep. 3, 2015

(30) Foreign Application Priority Data
Sep. 4, 2012 (FR) ..................... 12 58224

(51) Int. Cl.
*C30B 15/04* (2006.01)
*H01L 31/047* (2014.01)
(Continued)

(52) U.S. Cl.
CPC ............ *H01L 31/047* (2014.12); *C30B 15/04* (2013.01); *C30B 29/06* (2013.01);
(Continued)

(58) Field of Classification Search
CPC .......... C30B 29/06; C30B 15/02; C30B 15/04
See application file for complete search history.

(56) References Cited

U.S. PATENT DOCUMENTS 3,690,953 A    9/1972  Wise
3,969,746 A    7/1976  Kendall et al.
(Continued)

FOREIGN PATENT DOCUMENTS

EP    2 405 487 A1    1/2012
JP    S59-083996 A    5/1984
(Continued)

OTHER PUBLICATIONS

Pozner et al., "Vertical Junction Si Cells for Concentrating Photovoltaics," Progress in Photovoltaics: Research and Applications, 2012, vol. 20, pp. 197-208.
(Continued)

*Primary Examiner* — Robert M Kunemund
(74) *Attorney, Agent, or Firm* — Oliff PLC

(57) ABSTRACT

The present invention relates to a method for manufacturing a monolithic silicon wafer (10) comprising multiple vertical junctions (2) having an alternation of n-doped areas and p-doped areas, including at least the steps of: (i) providing a liquid bath (100) including silicon, at least one n-type doping agent and at least one p-type doping agent; (ii) proceeding to directionally solidify the silicon in a direction
(Continued)

(I), varying the convection-diffusion parameters thereof in order to alternate the growth of n-doped silicon layers (101) and p-doped silicon layers (102); and (iii) cutting a slice (104), parallel to the direction (I), of the multi-layer structure obtained at the end of the step (ii), such as to obtain said expected wafer (10).

32 Claims, 3 Drawing Sheets

(51) Int. Cl.
| | |
|---|---|
| *C30B 29/06* | (2006.01) |
| *H01L 31/0352* | (2006.01) |
| *H01L 31/068* | (2012.01) |
| *H01L 31/18* | (2006.01) |
| *H01L 31/0288* | (2006.01) |
| *H01L 31/0687* | (2012.01) |

(52) U.S. Cl.
CPC .... *H01L 31/0288* (2013.01); *H01L 31/03529* (2013.01); *H01L 31/068* (2013.01); *H01L 31/0687* (2013.01); *H01L 31/1804* (2013.01); *H01L 31/1876* (2013.01); *Y02E 10/547* (2013.01); *Y02P 70/521* (2015.11)

(56) References Cited

U.S. PATENT DOCUMENTS

| | | | |
|---|---|---|---|
| 4,116,717 A | 9/1978 | Rahilly | |
| 4,140,610 A | 2/1979 | Morimoto | |
| 4,297,717 A | 10/1981 | Li | |
| 4,320,247 A | 3/1982 | Gatos et al. | |
| 4,428,783 A | 1/1984 | Gessert | |
| 2007/0034250 A1 | 2/2007 | Dutta | |
| 2010/0006139 A1 | 1/2010 | Zahuranec et al. | |
| 2012/0301386 A1* | 11/2012 | Johnson | C30B 15/04 |
| | | | 423/348 |
| 2013/0180565 A1 | 7/2013 | Manabu | |

FOREIGN PATENT DOCUMENTS

| | | |
|---|---|---|
| JP | 2006-173381 A | 6/2006 |
| JP | 2011-046564 A | 3/2011 |
| WO | 2009/119342 A1 | 10/2009 |

OTHER PUBLICATIONS

Garandet et al., "On the Scaling Analysis of the Solute Boundary Layer in Idealized Growth Configurations," Journal of Crystal Growth, 1990, vol. 106, pp. 437-444.

Korol'Chenko et al., "Spectral and Photoelectric Parameters of High-Voltage Multi-Junction Solar Batteries, Russian Microelectronics," 2011, vol. 40, No. 8, pp. 620-623.

Written Opinion issued in French Application No. 1258224.

Jan. 2, 2014 International Search Report issued in International Application No. PCT/IB2013/058262.

Jan. 2, 2014 Written Opinion issued in International Application No. PCT/IB2013/058262.

Jun. 12, 2016 English translation of Office Action issued in Japanese Application No. 2015-529199.

* cited by examiner

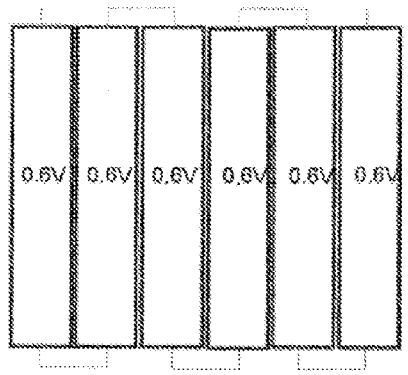
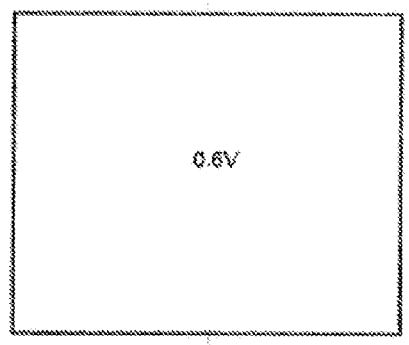
Figure 3a          Figure 3b
FIGURE 3
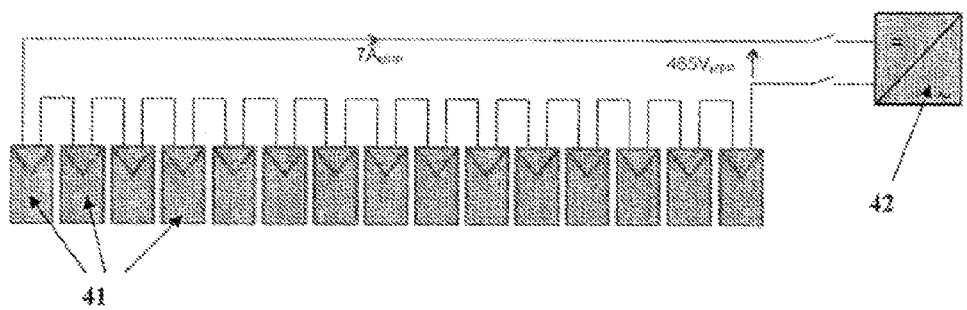
FIGURE 4

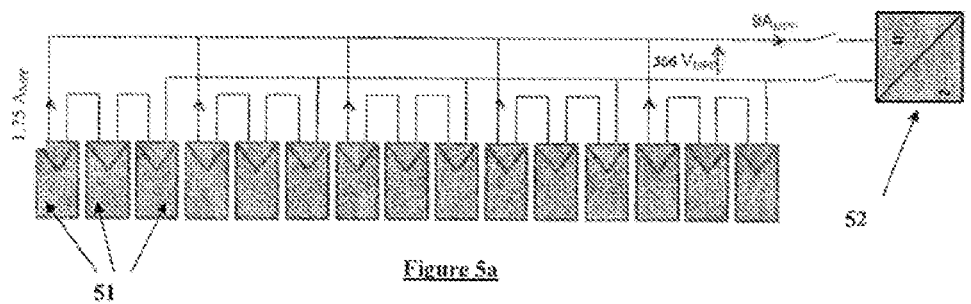
Figure 5a
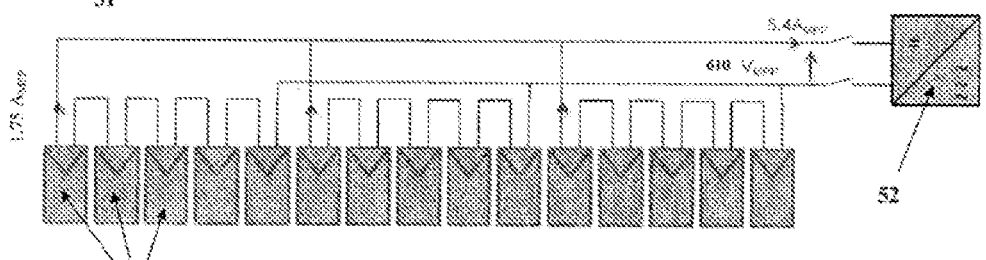
Figure 5b
FIGURE 5
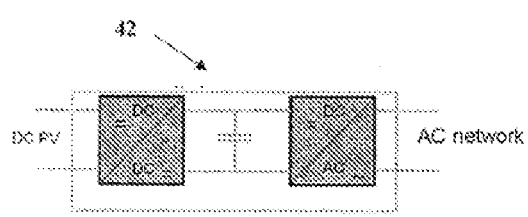
Figure 6a
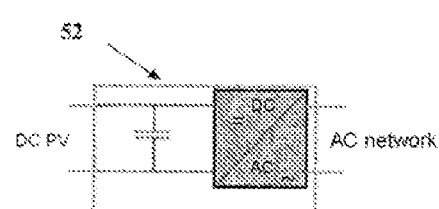
Figure 6b
FIGURE 6

METHOD FOR MANUFACTURING A MONOLITHIC SILICON WAFER COMPRISING MULTIPLE VERTICAL JUNCTIONS

The present invention relates to a novel method for fabricating a monolithic silicon wafer with vertical p-n multijunctions.

Such a wafer is particularly advantageous in the context of the creation of photovoltaic cells and modules.

Currently, the photovoltaic modules (PV) are mostly fabricated from the assembly of mono- or multi-crystalline silicon cells, these cells being generally produced from wafers, of electrical conductivity p.

In PV modules of reasonable size, of the order of a m², the size standard for the wafers (156×156 mm) means that the open-circuit voltages ($V_{oc}$) of the PV modules are limited to a few tens of volts.

Various pathways have been explored to try to increase the voltage $V_{oc}$ of the PV modules.

A first option could consist in using materials other than crystalline silicon (Si), notably semiconductors exhibiting band-gap amplitudes greater than 1.1 eV (electron-volt) of silicon, such as, for example, material of amorphous Si on crystalline Si type, obtained from the so-called heterojunction technology, or even materials of the CdTe (cadmium telluride) type. Unfortunately, the improvement in terms of open-circuit voltages is limited, because the use of semiconductors with excessively high band gap (>2 eV) results in a significant lowering of the quantities of photons absorbed and a loss in energy conversion efficiency.

Another possibility would be to reduce the size of the cells compared to the current standard of 156×156 mm, which would make it possible, by serially connecting a greater number of cells forming the module, to increase the value of the voltage $V_{oc}$. However, this solution would make the operations of handling for the creation of the modules more difficult. Moreover, the need to keep a space between cells forming the PV module for connections leads to a loss of useful surface area (i.e. allowing for the photogeneration of electrical carriers). This loss of surface area is greater with the implementation of a larger number of cells of smaller size.

To try to reduce this loss of useful surface area, it would be possible to consider producing a monolithic wafer of standard size 156×156 mm, and to a posteriori etch trenches, for example by laser ablation, which would have the effect of effectively creating a plurality of cells of smaller size. However, the etching process is likely to lead to an embrittlement of the wafer, and therefore to mechanical strength problems. Moreover, the problem of isolation between the sub-cells is complex, especially if a significant insulation resistance is needed for the targeted applications.

Gatos et al, (U.S. Pat. No. 4,320,247) propose exploiting oxygen concentration fluctuations that exist naturally in a p-type silicon crystal obtained by directed solidification according to the Czochralski method, to obtain, after cutting of the crystal and activation by thermal bake of oxygen-based thermal donors, wafers of p/n structure. The thermal donors, small agglomerates of oxygen which may be generated in the silicon wafers by thermal bake at temperatures of 400-500° C., behave as electron donors, and may thus bring about a compensation of the material and its change of conductivity. Unfortunately, the oxygen concentration fluctuations, and therefore the size of the n and p zones in the final wafer, typically of the order of a hundred or so microns, are difficult to control.

More recently, Pozner et al. (Progress in Photovoltaics 20 (2012), 197) have envisaged, by modeling, the series connection of cells with vertical p-n junction planes, unlike the configuration of the conventional wafers in which the junction plane is horizontal. The benefit of this approach is being able to envisage a process of collective type, on monolithic substrate, for the production of the cells. However, several technical issues remain unresolved, with regard to the practical production of such a structure, the cost of which, moreover, risks being very high.

Consequently, there remains a need for a method to be available for fabricating wafers that are appropriate for the production of PV modules with high open-circuit voltage, and that minimizes the inactive surfaces (i.e, that does not allow for the collection of photogenerated carriers).

The present invention aims precisely to address this need.

More particularly, it proposes a method for fabricating monolithic silicon wafers with vertical p-n multijunctions.

The present invention thus relates, according to a first of its aspects, to a method for fabricating a monolithic silicon wafer with vertical multijunctions exhibiting an alternation of n-doped zones and of p-doped zones, comprising at least the steps consisting in:

(i) providing a liquid bath containing silicon, at least one n-type doping agent and at least one p-type doping agent;

(ii) proceeding to directionally solidifying the silicon in a direction (I), by varying the convection-diffusion parameters to alternate the growth of n-doped silicon layers and of p-doped silicon layers; and (iii) cutting a slice, parallel to the direction (I), of the multilayer structure obtained on completion of the step (ii), so as to obtain said expected wafer.

Thereinafter in the text, a silicon layer or zone mostly including one or more p-type doping agents (respectively one or more n-type doping agents) will be more simply designated up-doped (respectively "n-doped") layer or zone.

Unlike the method described in the document U.S. Pat. No. 4,320,247, the n-doped zones are thus formed during the directional solidification of the silicon, and in no way result from a subsequent activation, by bake, of interstitial oxygen-based thermal donors.

Hereinafter in the text, and unless indicated otherwise, the wafer is characterized when observed in its horizontal position.

Thus, in particular, the wafer is defined as exhibiting "vertical" junctions in a vertical cutting plane of the wafer positioned horizontally.

According to another of its aspects, the present invention relates to a monolithic silicon wafer with vertical multijunctions, in particular obtained according to the method defined previously, said wafer exhibiting, in at least one vertical cutting plane, an alternation of n-doped zones and of p-doped zones, each of the zones extending over the entire thickness of the wafer and having a width in the cutting plane of at least 2 mm.

It relates also to a photovoltaic device, in particular a photovoltaic cell, comprising such a silicon wafer.

Advantageously, the silicon wafers according to the invention, divided into a plurality of sub-cells of smaller size, make it possible to produce PV modules exhibiting an increased open-circuit voltage, while retaining a reasonable standard size of the order of a m².

By way of exemplary application, these high-voltage PV modules allow, as explained hereinbelow in the text, novel configurations of assembly of the PV modules in a PV system, more particularly allowing for a standardization of the voltage levels between the PV modules and the inverter in a photovoltaic installation.

Thus, the present invention relates also, according to another of its aspects, to a photovoltaic system comprising a plurality of photovoltaic devices as defined previously, associated in series and/or in parallel so as to allow the adjustment of the input voltages of the inverters associated with said system.

Other features, advantages and modes of application of the method, of the silicon wafers and photovoltaic devices according to the invention, will become more apparent on reading the following detailed description of exemplary embodiments of the invention and on studying the attached drawings, in which:

FIG. 3 represents, schematically, the architectures of a PV cell according to the invention (FIG. 3a), subdivided into six sub-cells, and producing a voltage of 3.6 V, and of a conventional PV cell (FIG. 3b) producing a voltage of 0.6 V.

FIG. 4 represents an exemplary configuration of a conventional PV installation, comprising one chain of 15 PV modules in series (module specifications: 7 $A_{MPP}$, 31 $V_{MPP}$, 217 $W_c$, in which $A_{MPP}$ denotes the maximum power current, $V_{MPP}$ the maximum power voltage, and the maximum power at a temperature of 25° C.).

FIG. 5 represents two novel configurations envisaged with PV modules created from PV cells of the invention (module specifications: 1.75 $A_{MPP}$; 122 $V_{MPP}$, 216 $W_c$): configuration of five chains of three modules leading to a DC bus voltage of 366 $V_{MPP}$ (FIG. 5a) and configuration of three chains of five modules leading to a bus voltage of 610 $V_{MPP}$ (FIG. 5b).

Figure 1:
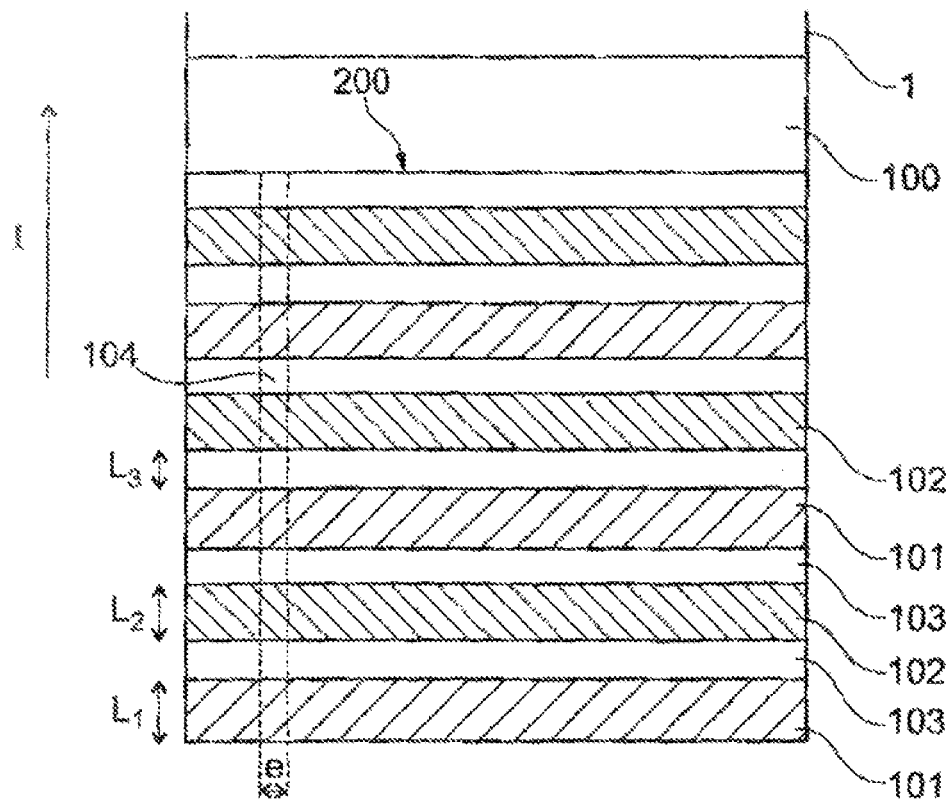
FIG. 1 represents, schematically and partially, in cross section, the multilayer structure formed during the step (ii) of the method of the invention.

In FIGS. 4 and 5, conventionally, $A_mpp$ is used to denote the maximum power current, $V_{MPP}$ to denote the maximum power voltage at a temperature of 25° C.

FIG. 6 represents an architecture of a conventional PV inverter (FIG. 6a) and the novel architecture of an inverter that is allowed according to the invention (FIG. 6b).

It should be noted that, for reasons of clarity, the different elements in the figures are not represented to scale, the real dimensions of the different parts not being observed.

Hereinafter in the text, the expressions "lying between . . . and . . . ", "ranging from . . . to . . . ," and "varying from . . . to . . . " are equivalent and are intended to mean that the limits are included, unless stipulated otherwise.

Unless indicated otherwise, the expression "including/comprising a" should be understood to mean "including/comprising at least one".

Fabrication of the Wafer

Step (i) Liquid Bath

As specified previously, the step (i) of the method of the invention consists in providing a liquid bath, also called "melt" bath, containing silicon, at least one n-type doping agent and at least one p-type doping agent.

Said p-type doping agent or agents may be chosen from boron (B), aluminum (Al), gallium (Ga), indium (In), zinc (Zn) and their mixtures.

Preferably, the p-type doping agent is boron.

The p-type doping agent or agents may be, more particularly, present in the liquid bath in a proportion ranging from $5 \cdot 10^{15}$ to $10^{17}$ atoms per $cm^3$, in particular from $10^{16}$ to $4 \cdot 10^{16}$ atoms per $cm^3$.

Said n-type doping agent or agents may be chosen from phosphorous (P), arsenic (As), antimony (Sb), tin (Sn) and their mixtures.

Preferably, the n-type doping agent is antimony.

The n-type doping agent or agents may be, more particularly, present in the liquid bath in a proportion ranging from $10^{16}$ to $5 \cdot 10^{18}$ atoms per $cm^3$, in particular from $10^{17}$ to $10^8$ atoms per $cm^3$.

Preferably, the p-type doping, agent is boron and the n-type doping agent is antimony.

Obviously, it is for the person skilled in the art to adapt the volume of the liquid bath implemented in step (i) of the method of the invention, notably in light of the dimensions of the desired silicon wafer.

The preparation of the liquid bath implemented in step (i) of the method of the invention falls within the general knowledge of those skilled in the art.

For example, the liquid bath may be formed previously by mixing, in solid phase, silicon, n-type doped silicon wafers and p-type doped silicon wafers and/or n and p-doped silicon wafers, followed by heating everything to a temperature higher than the melting point of silicon.

According to a particular embodiment, the liquid bath is stirred prior to its implementation in step (ii) of the method of the invention, using an agitation system, such as, for example, by magnetic agitation, agitation by vibrating table, etc., in order to ensure a good homogeneity of the bath, in particular a good dispersion of the n-type and p-type doping agents in the liquid silicon.

Said liquid bath may be produced in a silica or graphite crucible (possibly covered with a layer of SiC). The crucibles are known to withstand heating to temperatures high enough to obtain the liquid bath.

Step (iii): Directional Solidification of the Silicon

In a second step of the method of the invention, the silicon is directionally solidified in a direction (I), by varying the convection-diffusion parameters to alternate the growth of n-doped silicon layers and of p-doped silicon layers.

Generally, the directional solidification methods involve, either a pulling method, or a method based on gradual cooling of the liquid bath, contained in a vessel, in particular a crucible, below its melting point, from one of its ends, until it solidifies.

The step (ii) of directional solidification according to the method of the invention may be carried out by any pulling method known to those skilled in the art, such as, for example, by the Czochralski pulling method or even the so-called Bridgman method.

It may also be performed by a gradient cooling method, also known as "gradient freeze".

Setting up the apparatus suitable for the selected growth method falls within the general knowledge of those skilled in the art.

Preferably, the step (ii) of directional solidification of the silicon is carried out by a pulling method.

The direction of growth (I) may be more particularly parallel to the longitudinal axis of the vessel. The longitudinal axis of the vessel denotes the line joining all the barycenters of the cross sections of said vessel (walls of the vessel included). The longitudinal axis may be an axis of symmetry for the vessel.

The convection-diffusion parameter, denoted Δ, for a given species, may be defined by the following relationship:

$$\Delta = V_1 \delta / D$$

in which:
$V_1$ represents the rate of growth, that is to say of propagation of the liquid/solid interface of the silicon, measured in the direction (I);
D is the diffusion coefficient of the species concerned; and
δ is the thickness of the solutal boundary layer at the front of the liquid/solid interface.

Without wanting to be bound by theory, the effective partition coefficient $k_{\mathit{eff}}$ of a given species, defined as the ratio of the concentration incorporated in the solid with the concentration, in the bath far from the interface, depends directly on the convection-diffusion parameter A according to the following relationship:

$$k_{\mathit{eff}} = k/(1-(1-k)\Delta),$$

with k being the thermodynamic partition coefficient of the species concerned, given by the phase diagram.

It is thus possible according, to the invention, by controlling the value of the convection-diffusion parameters with respect to the n and p doping agents implemented, to obtain the growth of n-doped silicon or of p-doped silicon. More specifically, the content of a doping agent incorporated in the solid is given by the product of the effective partition coefficient $k_{\mathit{eff}}$ with the concentration of this doping agent in the bath, the latter being set at the start of the method.

According to a first variant embodiment of the invention, the variation of the convection-diffusion parameter in step (ii) may be carried out via the variation of the rate of solidification of the silicon, in particular between at least a value $V_1$ conducive to the growth of an n-doped silicon, and a value $V_2$ conducive to the growth of a p-doped silicon.

In as much as the n-type and p-type dopants do not have the same diffusion coefficient, their convection-diffusion parameters will not follow the same variations when the rate of solidification changes from $V_1$ to $V_2$, and it will thus be possible to obtain an alternate growth of n and p materials.

The person skilled in the art is able to adjust the values of the rates of solidification $V_1$ and $V_2$ respectively allowing for the growth of an n-doped silicon and of a p-doped silicon.

Also, the general knowledge of a person skilled in the art includes how to adapt the operating parameters and conditions of the growth method used to vary the rate of solidification.

As an example, in the context of the solidification of silicon by a pulling method, for example by the Czochralski pulling method, the rate of solidification may be adjusted via the control of the pulling speed, as illustrated in the following example.

According to a second variant embodiment of the invention, the variation of the convection-diffusion parameter in step (ii) may be carried out via the variation of the level of agitation, of the liquid bath, in particular between at least a value $B_1$ conducive to the growth of an n-doped silicon, and a value $B_2$ conducive to the growth of a p-doped silicon.

In effect, as reported in the article "Scaling analysis of the solute boundary layer in the idealized growth configurations" by J. P. Garandet et al. (Journal of Crystal Growth 106 (1990) 437-444 North Holland), the level of agitation of the liquid bath has a direct impact on the value of the thickness of the solutal boundary layer δ.

In as much as the n-type and p-type dopants do not have the same diffusion coefficient, their convection-diffusion parameters will not follow the same variations when the level of agitation changes from $B_1$ to $B_2$, and it will thus be possible to obtain an alternate growth of a and p materials.

A person skilled in the art is able to implement the appropriate methods to adjust the level of agitation of the liquid bath, allowing for the growth of the n-doped silicon or of the p-doped silicon.

The level of agitation may, for example, be adjusted by forced rotation of the crystal and/or of the crucible in a Czochralski-type pulling method, using an alternating magnetic field, rotating or sliding, a mechanical blade, a propeller or a disk.

Reference is made hereinbelow to FIG. 1 which represents, schematically and partially, the state of the system at a given instant during the step (ii) of the method of the invention.

The solidification is carried out in a vessel (1) which may, for example, be a silica or graphite crucible. The liquid/solid interface (200), separating the liquid bath (100) from the silicon in the solid state, is propagated in the direction (I).

The multilayer structure, also called "ingot", formed according to the invention, exhibits a succession of n-doped layers (101) and of p-doped layers (102).

The growth times of each of the n-doped and p-doped layers in step (ii) are adjusted so as to obtain the desired thickness fix each of the doped layers formed.

In particular, they are adjusted in such a way that said n-doped (101) and p-doped (102) layers formed on completion of the step (ii) exhibit, independently of one another, a thickness ($L_1$, $L_2$) in the direction (I), of at least 2 mm, in particular ranging from 2 mm to 10 cm, and more particularly from 5 mm to 5 cm.

The expression "independently of one another" should be understood to mean that the thickness ($L_1$) of the n-doped layers may differ from the thickness ($L_2$) of the p-doped layers, or even that the thickness may differ from one n-type doped layer to another n-type doped layer, or from one p-type doped layer to another p-type doped layer.

These thicknesses ($L_1$, $L_2$) may be adjusted according to the knowledge of a person skilled, in the art with a view to producing the final wafer, as described more specifically hereinbelow.

In particular, since the n-type materials are generally less sensitive to metal impurities than the p-type materials, the photogenerated currents are generally higher in the n-doped zones than in the p-doped zones. A person skilled in the art is able to adapt the thicknesses ($L_1$, $L_2$) of the p-doped and n-doped layers, notably with a view to best equalizing these currents in the final silicon wafer.

Also, the final thickness of the multilayer structure formed in step (ii) is adjusted with respect to the total length (L) desired for the silicon wafer.

Intermediate Layer

According to a particularly preferred embodiment, as represented in FIG. 1 the growth of an intermediate layer (103) is carried out between the growth of an n-doped silicon layer (101) and of a p-doped silicon layer (102).

These intermediate layers may be designated without preference as "interzones", "electrical isolation zones" or even "compensated zones".

In particular, this intermediate layer may exhibit a resistivity greater than or equal to 80 Ω·m, in particular greater than or equal to 400 Ω·m, preferably greater than or equal to 2000 Ω·m.

The resistivity may be measured by any conventional method, such as, for example, by the so-called four-point probe measurement method, or even by measuring the effect of the eddy currents induced by an alternating magnetic field.

Preferably, the intermediate layers exhibit a thickness ($L_3$), in the direction (I) of solidification, ranging from 50 µm to 5 mm, preferably from 100 µm to 500 µm.

In effect, an excessively long intermediate zone in the final silicon wafer is likely to lead to a loss of active material and therefore a lowering of the energy efficiency in the module which will be formed from these wafers. On the other hand, an excessively short intermediate zone may prove inadequate for ensuring a good isolation between the sub-cells (n-doped zones and p-doped zones), which may also lead to a lowering of efficiency in the resulting module.

As explained previously for the growth of the n-doped and p-doped layers, the growth of the intermediate layers is more particularly carried out, by adjusting the convection-diffusion parameters for each of the doping species, at an intermediate value between the values conducive to the growth of the p and n zones.

According to a first variant embodiment, in the context of an adjustment of the convection-diffusion parameter in step (ii) via the variation of the rate of solidification, the intermediate layer may be formed by adapting the rate of solidification to an intermediate value $V_3$ between $V_1$ and $V_2$.

Thus, according, to a particular embodiment, the step (ii) of the method of the invention may be carried out by varying the rate of solidification of the silicon according to the repetition of the cycle $V_1$-$V_3$-$V_2$-$V_3$-, with $V_1$ being the rate conducive to the growth of the ti-doped silicon, $V_2$ being the rate conducive to the growth of the p-doped silicon and $V_3$ being the rate conducive to the growth of said intermediate layer, to lead to a multilayer structure as represented in FIG. 1.

According to a second variant embodiment, in the context of the variation of the convection-diffusion parameter in step (ii) via the variation of the level of agitation of the liquid bath, the intermediate layer may be formed by adapting the level of agitation to an intermediate value $B_3$ between $B_1$ and $B_2$.

Thus, according to another particular embodiment, the step (ii) may be carried out by varying the level of agitation of the bath according to the repetition of the cycle $B_1$-$B_3$-$B_2$-$B_3$-, with $B_1$ being the level of agitation conducive to the growth of the n-doped silicon, $B_2$ being the level of agitation conducive to the growth of the p-doped silicon and $B_3$ being the level of agitation conducive to the growth of said intermediate layer, to lead to a multilayer structure as represented in FIG. 1.

Addition of Silicon to the Liquid Bath

According to a particular embodiment, during the step (ii), silicon, in solid or liquid form, in the melt bath, is added into the liquid bath, preferably progressively, and in quantities such that they make it possible to compensate the enrichment of the liquid bath with a and p dopants as the silicon solidifies.

Without wanting to be bound by theory, such an addition of silicon during the step (ii) advantageously makes it possible to limit the phenomenon of macrosegregation of the dopants the latter being likely to induce a variation of the resistivity of the layers parallel to the direction (I), of growth.

Step (iii): Obtaining the Silicon Wafer

According to a third step of the method of the invention, a slice (104) is cut, parallel to the direction (I), from the multilayer structure obtained on completion of the step (ii), as represented in FIG. 1, so as to obtain the expected wafer (10).

The multilayer structure obtained on completion of the step (ii) of the method of the invention may be previously brought to ambient temperature and stripped from the crucible before it is cut.

This cutting may be carried out by any conventional method known to those skilled in the art, for example by using grains of SIC as abrasives.

The dimensions of the slice that is cut are chosen in light of the dimensions of the desired silicon wafer, in particular its thickness (c) and its length (L).

Wafer

As seen previously, the present invention relates, according to yet another of the aspects, to a silicon wafer, in particular as obtained by the method described previously.

Reference will be made in the following description to the attached FIG. 2, which represents, schematically and in a vertical cutting plane, a silicon wafer according to the invention.

Figure 2:
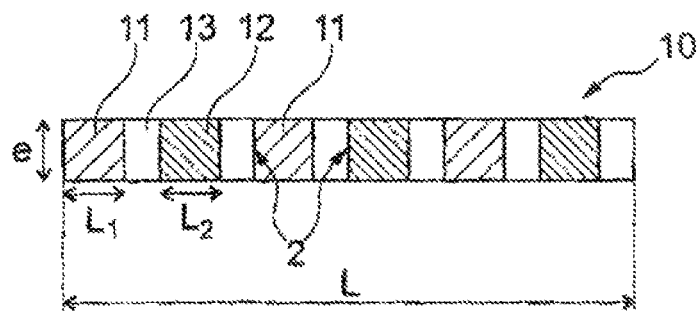
FIG. 2 represents, schematically, in a vertical cutting plane, the structure of a silicon wafer according to the invention.

As represented in FIG. 2, a silicon wafer (10) according to the invention exhibits, in at least one vertical cutting plane, an alternation of n-doped zones (11) and of p-doped zones (12), each of the zones extending over the entire thickness (e) of the wafer and having a width ($L_1$, $L_2$) in the cutting plane of at least 2 mm.

To the knowledge of the inventors, no silicon wafer exhibiting such an architecture has ever yet been proposed, in particular one exhibiting it width of the n-doped zones and of the p-doped zones greater than or equal to 2 mm.

According to a particular embodiment, a wafer according to the invention may exhibit a thickness (e) ranging from 100 to 500 µm, in particular from 150 to 300 µm.

According to another particular embodiment, a wafer according to the invention may exhibit a total length (L) ranging from 10 to 30 cm, in particular from 15 to 20 cm.

The n-doped zones (11) of the water may exhibit, independently of one another, an electron-type charge carrier density ranging from $10^{14}$ to $10^{17}$ cm$^{-3}$, in particular from $5 \cdot 10^{14}$ to $5 \cdot 10^{16}$ cm$^{-3}$.

They may exhibit a width ($L_1$) in the cutting plane ranging from 2 mm to 10 cm, in particular from 5 mm to 5 cm.

The p-doped zones (12) of the wafer may exhibit, independently of one another, a hole-type charge carrier density ranging from $10^{14}$ to $10^{17}$ cm$^{-3}$, in particular from $5 \cdot 10^{14}$ to $5 \cdot 10^{16}$ cm$^{-3}$.

They may exhibit a width ($L_2$) in the cutting plane ranging from 2 mm to 10 cm, in particular from 5 mm to 5 cm.

As described previously, according to a particular embodiment, the n-doped zones (11) and said p-doped zones (12) may be separated from one another by at least one intermediate zone (13), also called "electrical isolation zone".

These intermediate zones (13) are more particularly characterized by an electrical resistivity greater than or equal to 80 Ω·m, in particular greater than or equal to 400 Ω·m, preferably greater than or equal to 2000 Ω·m.

These intermediate zones (13) may exhibit a width ($L_3$) in the cutting plane ranging from 50 µm to 5 mm, in particular from 100 µm to 500 µm.

Photovoltaic Devices and Applications

The invention also relates, according to another of its aspects, to a photovoltaic device, in particular a photovoltaic cell or a photovoltaic module, comprising at least one silicon wafer as defined previously.

Those skilled, in the art can implement: the appropriate processes conventionally implemented to create a PV cell, from a monolithic silicon wafer according to the invention.

Of course, by their fabrication method, the wafers according to the invention exhibit, by comparison to the standard wafers whose conductivity is monotype and uniform over the entire surface of the wafer, greater variations of conductivity from one n-type (respectively p-type) zone to another, and within one and the same given n-type (respectively p-type) zone. Typically, the variations of conductivity are less than 20%, and even very often less than 10% on standard monotype wafers, whereas these variations may be by a factor 2 or more on the wafers according to the invention.

Also, the positions of the transitions between n and p zones are not necessarily identical for all the wafers obtained from the cutting of one and the same ingot because of problems of solid/liquid interface, curvature inherent to all the methods of solidification from the melt bath.

However, these characteristics are in no way prejudicial to the creation of the photovoltaic device, in particular of the cell. In effect, once the mapping of the surface of the wafer has been carried out to differentiate the n- and p-type zones, the inventors have found that the conventional techniques for creating PV cells such as diffusion of dopants in gaseous phase for the production of the p/n+ or n/p+ junctions, nitride deposition for passivation and limitation of reflectivity, screen printing for contacting, may be used on the silicon wafers according to the invention.

A PV cell according to the invention, created from a silicon wafer as descried previously, is subdivided in sub-cells of smaller size. Such PV cells make it possible to produce a high voltage level, while outputting less current.

By way of example, FIG. 3 represents, schematically, the architecture of a PV cell according to the invention (FIG. 3a), subdivided in six sub-cells, and producing a voltage of approximately 3.6 V, compared to a conventional PV cell (FIG. 3b) producing a voltage of approximately 0.6 V.

Such PV cells prove particularly advantageous for the creation of photovoltaic solar modules suitable for delivering a high voltage. More particularly, it is possible, by serially connecting PV cells according to the invention, to create a PV module of reasonable size, conventionally of a dimension of the order of 1 m², and exhibiting a higher voltage compared to the modules created from conventional cells.

According to yet another of its aspects, the present invention relates to a photovoltaic module formed from a set of photovoltaic cells according to the invention.

By way of illustration, the high-voltage modules formed from PV cells according to the invention find a particularly advantageous application in facilitating the dimensioning of a photovoltaic installation, more particularly via the standardization of the voltage levels between the PV modules and the inverter in a photovoltaic system.

Thus, the present invention further relates, according to another of its aspects, to a photovoltaic system comprising a plurality of photovoltaic devices as defined previously, associated in series and/or in parallel so as to allow the adjustment of the input voltages of the inverters associated with said system.

Generally, as represented in FIG. 4, a PV installation combines, on the one hand, PV modules (41), direct current (hereinafter denoted DC) electrical generators each formed from a set of electrically connected PV cells, and, on the other hand, an inverter (42) whose function is to transform the direct current DC into alternating current (denoted AC), adapted to a distribution network, for example to the French EDF mains network. The interface between these two major components of the PV installation, hereinafter designated "the DC bus" of the PV system, makes it possible to have the current produced by the PV modules (41) flow to the inverter (42) at a certain voltage.

By way of example, FIG. 4 represents a conventional PV installation, comprising a series assembly of 15 modules (41) each producing a voltage of 31 $V_{MPP}$, which results in a DC bus voltage of 465 $V_{MPP}$.

The voltage of the DC bus, which is linked to the PV modules implemented, must be matched to the range of input voltages that the inverter may accept. Now, the voltage level may be highly variable from one PV module to another. Similarly, the operating voltages vary from one inverter to another.

The input voltage range of the inverters is generally wide, so as to make it possible to adapt to a maximum of eases (types of modules and number of modules per chain). However, this wide voltage range makes it necessary, in the design of the inverter, to form a specific DC/DC conversion stage, as schematically represented in FIG. 6a, which is costly in terms of components and efficiency.

Consequently, the dimensioning of a photovoltaic installation remains relatively difficult, because a fit has to be found between the number of modules in the chain, the rated power of the modules and the rated power of the inverter. This fit represents a time constraint for the installer and a risk of dimensioning error.

Also, in the current PV installations, in which the modules are generally positioned in series to obtain a sufficient DC bus voltage, the failure of one module comes to effect the operation of the whole PV system.

Finally, the current is often high in the PV modules for relatively low output voltages, which implies losses in the conductors, the solder joints and terminal blocks of the PV system.

The only means currently proposed for matching the modules to the inverter consist in using DC/DC or directly DC/AC converters on each PV module, called "micro-converters" or "power optimizers". However, implementing micro-converters is complex and necessitates the deployment of numerous components in the PV field as a whole, which creates maintenance difficulties. Furthermore, the plurality of apparatuses increases the risk of Calm, the components being confronted with more significant temperature deviations. Finally, there remains the problem of high current in the PV modules, as well as the voltage and power adaptability of these micro-converters with the PV modules implemented.

Advantageously, the high-voltage PV modules created according to the invent on allow, as explained hereinbelow, the creation of simple module+inverter systems that are optimized in terms of voltage and current, and that make it possible to mitigate all the drawbacks discussed previously.

The design and the advantages of these novel PV systems will emerge on reading the following description, given purely by way of example and making reference to the attached figures.

In light of the constraints explained previously in tents of dimensioning, it would be particularly advantageous to be able to standardize the direct current bus voltage at a fixed value for all the module and inverter technologies.

This standardization must take account of the sole real constraint on the voltage levels: the voltage of the distribution network, for example for the French EDF mains network: 230 $V_{AC}$ single-phase or 400 $V_{AC}$ three-phase. Starting from these quantities, the optimum value of the DC voltage to ensure a maximum DC to AC conversion efficiency may be estimated at approximately 366 V for the single-phase case and 610 V for the three-phase case.

Thus, a voltage level for the output of the PV modules, compatible with these two constraints, may be, for example, 122 $V_{MPP}$ per PV module.

FIG. 5 presents two configurations that can be envisaged with modules according to the invention and that make it possible to address the abovementioned requirements. More particularly:

FIG. 5a presents a configuration of five chains mounted in parallel, each being formed by three modules (51) in series (module specification: 1.75 $A_{MPP}$; 122 $V_{MPP}$, 216 $W_c$), which makes it possible to obtain a DC bus voltage of 366 $V_{MPP}$; and FIG. 5b presents a configuration of three chains mounted in parallel, each being formed by five modules (51), which results in a DC bus voltage of 610 $V_{MPP}$.

Obviously, the two configurations of FIG. 5 are presented by way of illustration and are not limiting on the invention. It is for example also possible to configure modules of approximately 61 V, 30.5 V, 15.25 V, 5.08 V, all sub-multiples of 122 V. These novel configurations are allowed by the ability of the modules created from PV cells according to the invention to deliver a high voltage.

In effect, obtaining a PV module delivering a voltage of 122 V with conventional wafers, of conventional size of 156×156 mm, and characterized for example by a voltage of 0.6 V/wafer and a current of 7 A as represented in FIG. 3b, would entail implementing a large number of cells (203 wafers in the case in point), and would therefore result in a PV module of 850 W rated power exhibiting a high surface area (of the order of 5 m²). Modules exhibiting such a surface area are difficult to handle. Furthermore, this architecture retains a high current resulting in losses in the conductors of the PV modules.

On the other hand, by virtue of the novel PV cells created according to the invention subdivided into sub-cells as represented in FIG. 3a, it is possible to access a module exhibiting a voltage of 122 V and a current of approximately 1.75 A while retaining a reasonable size of the order of a m² (for example from the assembly of 34 cells producing a voltage of 3.6 V/wafer as represented in FIG. 3a).

To sum up, with the wafer as described in this application, it is possible to produce a PV module that delivers, with surface parity, the same rated power as a conventional module, but with a higher voltage and a lower current. The novel PV systems as illustrated in FIGS. 5a and 5b prove particularly advantageous in a number of ways.

On the one hand, they make it possible to supply a standardized DC bus voltage, in the case illustrated, previously, a voltage of 366 V or 610 V. It is thus no longer necessary for the inverter to have a wide DC input voltage range which advantageously makes it possible to eliminate a conversion stage for the inverter, and therefore to reduce its cost, its bulk and improve its reliability. By way of example, FIG. 6 schematically represents, on the one hand (FIG. 6a) the architecture of a conventional inverter (42) with two DC/DC and DC/AC conversion stages and, on the other hand, (FIG. 6b), the architecture of an inverter (52) that can be used in the novel PV systems presented previously, in which the first DC/DC conversion stage has been eliminated.

Also, as represented in FIG. 5, the currents are lower in the PV modules formed according to the invention, which makes it possible to reduce the losses in the conductors of PV modules and therefore the cross section of those conductors.

Moreover, the parallel-connected configurations of the modules make it possible to have a better robustness of the PV system to shadowing, for example in the case where one or more modules are not lit. Finally, in the case where a module proves defective, it is possible to replace it with a module with equivalent voltage without interrupting the operation of the PV system.

The invention will now be described by means of the following example obviously given by way of illustration and not limiting on the invention.

EXAMPLE i. Preparation of the Melt Bath

The melt bath is prepared from a silicon charge of electronic grade, to which are added doping wafers of boron and antimony, such that the initial melt bath exhibits a content of $5 \cdot 10^{17}$ atoms of antimony per cm³ and of $1.9 \cdot 10^{16}$ atoms of boron per cm³.

ii. Growth of N-Doped and P-Doped Silicon Layers

The growth of the silicon is carried out by the Czochralski pulling method.

The rate of solidification is adjusted by controlling the pulling speed of the rod supporting the initial seed.

The speed of rotation of the rod supporting the seed is fixed at 15 revolutions per minute throughout the solidification cycle.

A transient so-called shouldering phase, during which the pulling speed of the rod is set at 9.8 µm/s, enables the solid formed to pass from the diameter of the seed to that chosen for the crystal, in this case 6" or 150 mm, and this diameter is maintained constant throughout the solidification cycle.

As soon as the nominal diameter is reached, the pulling speed is maintained at 9.8 µm/s, for 30 seconds, to form a compensated zone, then reduced to a value of 3.8 µm/s.

The crystal is made to grow at this value of 3.8 µm/s for 13150 s, which makes it possible to solidify 5 cm of p-type zone.

The pulling speed is then set at 9.8 µm/s, for 30 seconds to once again form a compensated zone.

Then, the pulling speed is increased to 25.4 µm/s for 1900 s to grow 4.8 cm of n-type zone.

By taking account of the transients, the length of the transition zones between n and p materials is approximately 400 µm.

This cycle (9.8 µm/s–30 s, 3.8 µm/s–13150 s, 9.8 µm/s–30 s and 25.4 µm/s–1900 s) is repeated a second time, then the pulling speed is set at 9.8 µm/s until the end of the solidification cycle.

iii. Cutting of the Wafers

On completion of the growth process, the ingot is cut (conventional cutting method using grains of SiC as abrasives) into slices 250 µm thick and 20 cm long, the wafers obtained comprising two p-type zones and two n-type zones separated and bounded by compensated zones.

The invention claimed is:

1. A method for fabricating a monolithic silicon wafer with vertical multijunctions exhibiting an alternation of n-doped zones and of p-doped zones, comprising at least the steps consisting in:
   (i) providing a liquid bath containing silicon, at least one n-type doping agent and at least one p-type doping agent;
   (ii) proceeding to directionally solidifying the silicon in a direction, by varying the convection-diffusion parameters to alternate the growth of n-doped silicon layers and of p-doped silicon layers; and (iii) cutting a slice, parallel to the direction, of the multilayer structure obtained on completion of the step (ii), so as to obtain said expected wafer, wherein the step (ii) comprises, between the growth of an n-doped silicon layer and of a p-doped silicon layer, the growth of an intermediate layer, said intermediate layer exhibiting a resistivity greater than or equal to 80 Ω·m and a width in the cutting plane ranging from 50 μm to 5 mm.

2. The method as claimed in claim 1, in which the step (ii) of solidifying the silicon is carried out by a pulling method.

3. The method as claimed in claim 1, in which said p-type doping agent is chosen from boron (B), aluminum (Al), gallium (Ga), indium (In), zinc (Zn) and their mixtures.

4. The method as claimed in claim 1, in which said p-type doping agent is boron.

5. The method as claimed in claim 1, in which said n-type doping agent is chosen from phosphorous (P), arsenic (As), antimony (Sb), tin (Sn) and their mixtures.

6. The method as claimed in claim 1, in which said n-type doping agent is antimony.

7. The method as claimed in claim 1, in which said p-type doping agent is boron and said n-type doping agent is antimony.

8. The method as claimed in claim 1, in which the variation of the convection-diffusion parameter in step (ii) is carried out via the variation of the rate of solidification of the silicon.

9. The method as claimed in claim 8, in which the step (ii) is carried out by varying the rate of solidification of the silicon between at least a value $V_1$ conducive to the growth of the n-doped silicon, and a value $V_2$ conducive to the growth of the p-doped silicon.

10. The method as claimed in claim 8, in which the solidification of the silicon in step (ii) is performed by a pulling method, the rate of solidification of the silicon being adjusted via the control of the pulling speed.

11. The method as claimed in claim 10, in which the step (ii) is carried out by varying the rate of solidification of the silicon according to the repetition of the cycle $V_1$-$V_3$-$V_2$-$V_3$-, with $V_1$ being the rate conducive to the growth of the n-doped silicon, $V_2$ being the rate conducive to the growth of the p-doped silicon and $V_3$ being the rate conducive to the growth of said intermediate layer of intermediate value between $V_1$ and $V_2$.

12. The method as claimed in claim 1, in which the variation of the convection-diffusion parameter in step (ii) is carried out via the variation of the level of agitation of the liquid bath.

13. The method as claimed in claim 12, in which the step (ii) is carried out by varying the level of agitation of the liquid bath between at least a value $B_1$ conducive to the growth of the n-doped silicon and a value $B_2$ conducive to the growth of the p-doped silicon.

14. The method as claimed in claim 12, in which the level of agitation of the liquid bath is adjusted using an agitation system.

15. The method as claimed in claim 14, in which the level of agitation of the liquid bath is adjusted by forced rotation of the crystal and/or of the crucible in a Czochralski-type pulling method, using an alternating magnetic field, rotating or sliding, a mechanical blade, a propeller or a disk.

16. The method as claimed in claim 1, in which silicon, in solid or liquid form, is added into the liquid bath during the step (ii) in adequate quantities to compensate the enrichment of the liquid bath with n and p dopants as the silicon solidifies.

17. The method as claimed in claim 1, in which the respective times in step (ii) for solidification of the n-doped silicon and of the p-doped silicon are adjusted in such a way that said n-doped and p-doped layers formed on completion of the step (ii) exhibit, independently of one another, a thickness of at least 2 mm.

18. The method as claimed in claim 1, in which the respective times in step (ii) for solidification of the n-doped silicon and of the p-doped silicon are adjusted in such a way that said n-doped and p-doped layers formed on completion of the step (ii) exhibit, independently of one another, a thickness ranging from 2 mm to 10 cm.

19. The method as claimed in claim 1, in which the respective times in step (ii) for solidification of the n-doped silicon and of the p-doped silicon are adjusted in such a way that said n-doped and p-doped layers formed on completion of the step (ii) exhibit, independently of one another, a thickness ranging from 5 mm to 5 cm.

20. A monolithic silicon wafer with vertical multi-junctions, exhibiting, in at least one vertical cutting plane, an alternation of n-doped zones and of p-doped zones, each of the zones extending over the entire thickness of the wafer and having a width in the cutting plane of at least 2 mm, wherein said n-doped zones and said p-doped zones are separated from one another by at least one intermediate zone, said intermediate zone exhibiting a resistivity greater than or equal to 80 Ω·m and a width in the cutting plane ranging from 50 μm to 5 mm.

21. The wafer as claimed in claim 20, said wafer being formed according to a method for fabricating a monolithic silicon wafer with vertical multijunctions exhibiting an alternation of n-doped zones and of p-doped zones, comprising at least the steps consisting in:

(i) providing a liquid bath containing silicon, at least one n-type doping agent and at least one p-type doping agent;

(ii) proceeding to directionally solidifying the silicon in a direction, by varying the convection-diffusion parameters to alternate the growth of n-doped silicon layers and of p-doped silicon layers; and (iii) cutting a slice, parallel to the direction, of the multilayer structure obtained on completion of the step (ii), so as to obtain said expected wafer.

22. The wafer as claimed in claim 20, in which said n-doped zones exhibit, independently of one another, an electron-type charge carrier density ranging from $10^{14}$ to $10^{17}$ cm$^{-3}$.

23. The wafer as claimed in claim 20, in which said n-doped zones exhibit, independently of one another, a width in the cutting plane ranging from 2 mm to 10 cm.

24. The wafer as claimed in claim 20, in which said n-doped zones exhibit, independently of one another, a width in the cutting plane ranging from 5 mm to 5 cm.

25. The wafer as claimed in claim 20, in which said p-doped zones exhibit, independently of one another, a hole-type charge carrier density ranging from $10^{14}$ to $10^{17}$ cm$^{-3}$.

26. The wafer as claimed in claim 20, said p-doped zones exhibiting, independently of one another, a width in the cutting plane ranging from 2 mm to 10 cm.

27. The wafer as claimed in claim 20, in which said p-doped zones exhibit, independently of one another, a width in the cutting plane ranging from 5 mm to 5 cm.

28. The wafer as claimed in claim 20, in which each of said intermediate zones exhibits a width in the cutting plane ranging from 100 μm to 500 μm.

29. The wafer as claimed in claim 20, said wafer exhibiting thickness ranging from 100 to 500 μm.

30. The wafer as claimed in claim 20, said wafer exhibiting a total length in the cutting plane ranging from 10 to 30 cm.

31. A photovoltaic device, comprising a monolithic silicon wafer with vertical multi-junctions, exhibiting, in at least one vertical cutting plane, an alternation of n-doped zones and of p-doped zones, each of the zones extending over the entire thickness of the wafer and having a width in the cutting plane of at least 2 mm, wherein said n-doped zones and said p-doped zones are separated from one another by at least one intermediate zone, said intermediate zone exhibiting a resistivity greater than or equal to 80 Ω·m and a width in the cutting plane ranging from 50 μm to 5 mm.

32. A photovoltaic system comprising a plurality of photovoltaic devices as claimed in claim 31, associated in series and/or in parallel so as to allow the adjustment of the input voltages of the inverters associated with said system.

* * * * *